United States Patent
Sano

(10) Patent No.: US 11,269,015 B2
(45) Date of Patent: *Mar. 8, 2022

(54) BATTERY PACK CIRCUIT, CAPACITY COEFFICIENT DETECTION METHOD, AND CAPACITY COEFFICIENT DETECTION PROGRAM

(71) Applicant: Murata Manufacturing Co., Ltd., Nagaokakyo (JP)

(72) Inventor: Kosuke Sano, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 590 days.

This patent is subject to a terminal disclaimer.

(21) Appl. No.: 16/190,643

(22) Filed: Nov. 14, 2018

(65) Prior Publication Data

US 2019/0079138 A1    Mar. 14, 2019

Related U.S. Application Data

(63) Continuation of application No. PCT/JP2017/024613, filed on Jul. 5, 2017.

(30) Foreign Application Priority Data

Jul. 13, 2016  (JP) .............................. JP2016-138110

(51) Int. Cl.
*H02J 7/00*    (2006.01)
*H02J 7/14*    (2006.01)
(Continued)

(52) U.S. Cl.
CPC ......... *G01R 31/396* (2019.01); *G01R 31/367* (2019.01); *H01M 10/441* (2013.01);
(Continued)

(58) Field of Classification Search
USPC ......................................................... 320/134
See application file for complete search history.

(56) References Cited

U.S. PATENT DOCUMENTS 10,845,419 B2 * 11/2020 Sano .................... H01M 10/44
2007/0166607 A1 *  7/2007 Okada ................ H01M 10/441
                                                            429/90
(Continued)

FOREIGN PATENT DOCUMENTS

JP    2002010504 A    1/2002
JP    2004311308 A    11/2004
(Continued)

OTHER PUBLICATIONS

International Search Report issued for PCT/JP2017/024613 dated Aug. 8, 2017.
(Continued)

*Primary Examiner* — Alexis B Pacheco
(74) *Attorney, Agent, or Firm* — Arent Fox LLP

(57) ABSTRACT

A battery pack circuit controls the charging and discharging of a battery pack including a first standard cell having a first standard cell capacity coefficient/voltage characteristic curve and a shift cell having a shift cell capacity coefficient/voltage characteristic curve. The shift cell capacity coefficient/voltage characteristic curve mirrors the standard cell capacity coefficient/voltage characteristic curve but is offset from the standard cell capacity coefficient/voltage characteristic curve by a predetermined amount along a reference axis of the shift cell and standard cell capacity coefficient/voltage characteristic curves. A memory stores a potential difference characteristic curve for the standard and shift cells. A processor detects a present potential difference between the standard cell and the shift cell. A processor determines a present capacity coefficient value of the stan- (Continued)

dard cell as a function of the present potential difference detected by the processor and the potential difference characteristic curve.

15 Claims, 11 Drawing Sheets

(51) Int. Cl.
  *G01R 31/396*   (2019.01)
  *H01M 10/48*   (2006.01)
  *G01R 31/367*   (2019.01)
  *H01M 10/44*   (2006.01)

(52) U.S. Cl.
  CPC ......... *H01M 10/48* (2013.01); *H01M 10/482* (2013.01); *H02J 7/0016* (2013.01); *H02J 7/0021* (2013.01)

(56) References Cited

U.S. PATENT DOCUMENTS

| | | |
|---|---|---|
| 2011/0011653 A1 | 1/2011 | Mizutani et al. |
| 2016/0268651 A1* | 9/2016 | Arai ............... H02J 7/0049 |

FOREIGN PATENT DOCUMENTS

| | | |
|---|---|---|
| JP | 2007220658 A | 8/2007 |
| JP | 2008166025 A | 7/2008 |
| JP | 2011041452 A | 2/2011 |
| JP | 2013089522 A | 5/2013 |
| WO | 2015059746 A1 | 4/2015 |

OTHER PUBLICATIONS

Written Opinion of the International Searching Authority issued for PCT/JP2017/024613 dated Aug. 8, 2017.

* cited by examiner

BATTERY PACK CIRCUIT, CAPACITY COEFFICIENT DETECTION METHOD, AND CAPACITY COEFFICIENT DETECTION PROGRAM

CROSS REFERENCE TO RELATED APPLICATIONS

The present application is a continuation of International application No. PCT/JP2017/024613, filed Jul. 5, 2017, which claims priority to Japanese Patent Application No. 2016-138110, filed Jul. 13, 2016, the entire contents of each of which are incorporated herein by reference.

TECHNICAL FIELD

The present invention relates to a battery pack circuit, and more particularly to a battery pack circuit that controls the charging and discharging of a battery pack formed by a plurality of cells having a standard capacity. The present invention also relates to a capacity coefficient detection method and a capacity coefficient detection program for detecting a capacity coefficient of a cell constituting a battery pack.

BACKGROUND OF THE INVENTION

Conventionally, in order to determine the State Of Charge (SOC) of a battery (i.e., the battery capacity coefficient, specifically, charge depth), the open circuit voltage (OCV) of the battery is detected and the SOC is determined based on a pre-stored voltage-SOC table which indicates the relationship between the OCV and the SOC of the battery. The voltage-SOC table represents an OCV/SOC or cell capacity coefficient/voltage characteristic curve indicating the relationship between the OCV of the battery and the SOC of the battery.

However, it is not easy to detect the SOC of the battery in a potential plateau region of the cell voltage characteristic curve where the OCV does not change over a large area of SOC. For this reason, the SOC is detected based on a region other than the potential plateau region and an integrated value of a subsequent amount of current. However, in such a method, the detection accuracy of the SOC is limited. Because batteries such as a positive electrode LFP-negative electrode Gr type battery have a large plateau region, this standard method unacceptable for use with such (and similar) batteries.

Regarding the State Of Health SOH of the battery (i.e., battery capacity coefficient, specifically, degree of deterioration), general batteries make it possible to determine the deteriorated state of the battery by detecting that the $\Delta$ capacity/$\Delta V$ (i.e., the ratio of the variation width of the capacity to the variation width of the potential) which decreases with the deterioration. However, in a positive electrode LFP-negative electrode Gr type battery, the potential plateau region degenerates with deterioration and but the $\Delta$ capacity/$\Delta V$ does not, so that it is impossible to determine the deterioration state of the battery in this manner. In other words, in a battery having a large potential plateau region, since the SOH is quantified by integrating the current value, there is a limit to the detection accuracy of the SOH.

In view of these problems, Japanese Patent Application Laid-Open No. 2013-89522 (Patent Document 1) proposes the use of a lithium ion secondary battery for charge depth detection (detection cell) and a lithium ion secondary battery for non-charge depth detection (normal cell) having different initial battery capacities connected in series to form a battery pack. This makes it possible to accurately evaluate the charge depth without requiring a complicated determination circuit even during charge and discharge due to a large current.

In order to stably use the battery pack described in Patent Document 1 for a long period of time, it is necessary to independently prepare a voltage-SOC table based on the deterioration state of the detection cell and a voltage-SOC table based on the deterioration state of the normal cell and to monitor the deterioration state of each cell and to reset the SOC (make the SOC uniform) among the cells.

However, the need to monitor and reset two types of targeting cells having different performance and deterioration characteristics is complex. Also, in a power type battery that provides a large current with low resistance, it is difficult to design two types of cells with different material systems. Furthermore, in a conventional can type battery, there is no degree of freedom in the can and it is not easy to perform a different design such as that of an increase in capacity. As a result, the battery pack as in Patent Document 1 is not practical.

Therefore, a main object of the present invention is to provide a battery pack circuit which can easily detect a capacity coefficient with a high accuracy even in a potential plateau region.

BRIEF SUMMARY OF THE INVENTION

In accordance with one aspect of the invention, a battery pack circuit controls the charging and discharging of a battery pack. The battery pack circuit includes at least a first standard cell having a first standard cell capacity coefficient/voltage characteristic curve and a shift cell having a shift cell capacity coefficient/voltage characteristic curve. The shift cell capacity coefficient/voltage characteristic curve mirrors the standard cell capacity coefficient/voltage characteristic curve but is offset from the standard cell capacity coefficient/voltage characteristic curve by a predetermined amount along a reference axis of the shift cell and standard cell capacity coefficient/voltage characteristic curves. The battery pack circuit includes a memory storing potential difference characteristic curves for the standard and shift cells and a processor for determining a present capacity coefficient value of the standard cell. The processor determines the present capacity coefficient value of the standard cell by first determining a present potential difference between the standard cell and the shift cell and then determining a present capacity coefficient value of the standard cell as a function of the present potential difference and the potential difference characteristic curve.

In a preferred embodiment, the memory stores the standard cell capacity coefficient/voltage characteristic curve and the shift cell capacity coefficient/voltage characteristic curve. In some cases the potential difference characteristic curve has more than one capacity coefficient value for the detected present capacity coefficient value. In such a case, the processor determines the present capacity coefficient value of the standard cell by selecting one of the more than one standard capacity coefficient values as a function of either the standard cell capacity coefficient/voltage characteristic curve or the shift cell capacity coefficient/voltage characteristic curve.

In a preferred embodiment, the processor displays the present capacity coefficient value selected by the processor.

In a preferred embodiment, the present capacity coefficient value of the first standard cell is a first capacity coefficient value and the battery back includes a second standard cell having a second standard cell capacity coefficient/voltage characteristic curve. The memory stores a second potential difference characteristic curve for the second standard cell, the processor detects a present potential difference between the second standard cell and the shift cell, and the processor determines a present capacity coefficient value of the second standard cell based on the present potential difference between the second standard cell and the shift cell detected by the processor and the second potential difference characteristic curve. The battery pack circuit further includes a discharging circuit that adjusts a charge balance between the first and second standard cells based on the first and second capacity coefficient values.

In another aspect, the invention is directed towards a method for detecting a capacity coefficient of a first standard cell of which is part of a battery pack using a circuit which controls the charging and discharging of a battery pack. The battery pack includes a first standard cell having a first standard cell capacity coefficient/voltage characteristic curve and a shift cell having a shift cell capacity coefficient/voltage characteristic curve. The shift cell capacity coefficient/voltage characteristic curve mirrors that of the standard cell capacity coefficient/voltage characteristic curve but is offset from the standard cell capacity coefficient/voltage characteristic curve by a predetermined amount along a reference axis of the shift cell and standard cell capacity coefficient/voltage characteristic curves. The method comprises storing a potential difference characteristic curve for the standard and shift cells and determining a present capacity coefficient value of the standard cell by determining a present potential difference between the standard cell and the shift cell and then determining a present capacity coefficient value of the standard cell as a function of the present potential difference and the potential difference characteristic curve.

In some cases the potential difference characteristic curve has more than one capacity coefficient value for the detected present capacity coefficient value. In such a case, the present capacity coefficient value of the standard cell is determined by selecting one of the more than one standard capacity coefficient values as a function of either the standard cell capacity coefficient/voltage characteristic curve or the shift cell capacity coefficient/voltage characteristic curve.

In a preferred embodiment, the selected present capacity coefficient value is displayed.

In a preferred embodiment, the present capacity coefficient value of the first standard cell is a first capacity coefficient value and the battery back includes a second standard cell having a second standard cell capacity coefficient/voltage characteristic curve. In such a case, the method preferably includes storing a second potential difference characteristic curve for the second standard cell, detecting a present potential difference between the second standard cell and the shift cell, and determining a present capacity coefficient value of the second standard cell based on the present potential difference between the second standard cell and the shift cell detected by the processor and the second potential difference characteristic curve. In such a case, the charge balance between the first and second standard cells is preferably adjusted based on the first and second capacity coefficient values.

In another aspect of the invention, a non-transitory storage medium stores a program which that controls the charging and discharging of a battery pack which includes a first standard cell having a first standard cell capacity coefficient/voltage characteristic curve and a shift cell having a shift cell capacity coefficient/voltage characteristic curve. The shift cell capacity coefficient/voltage characteristic curve mirrors that of the standard cell capacity coefficient/voltage characteristic curve but is offset from the standard cell capacity coefficient/voltage characteristic curve by a predetermined amount along a reference axis of the shift cell and standard cell capacity coefficient/voltage characteristic curves. The program, when run on one or more processors, causing the battery back to store a potential difference characteristic curve for the standard and shift cells and to determine a present capacity coefficient value of the standard cell. The present capacity coefficient value is determined by determining a present potential difference between the standard cell and the shift cell and determining a present capacity coefficient value of the standard cell as a function of the present potential difference and the potential difference characteristic curve.

In some cases the potential difference characteristic curve has more than one corresponding capacity coefficient value for the detected present capacity coefficient value. In this case the program causes the battery pack to determine a present capacity coefficient value of the standard cell by selecting one of the more than one standard capacity coefficient values as a function of either the standard cell capacity coefficient/voltage characteristic curve or the shift cell capacity coefficient/voltage characteristic curve.

In a preferred embodiment the program causes the battery pack to display the selected present capacity coefficient value.

In at least one embodiment the present capacity coefficient value of the first standard cell is a first capacity coefficient value and the battery back includes a second standard cell having a second standard cell capacity coefficient/voltage characteristic curve. In such a case, the program preferably causes the battery pack to store a second potential difference characteristic curve for the second standard cell, detect a present potential difference between the second standard cell and the shift cell and determine a present capacity coefficient value of the second standard cell based on the present potential difference between the second standard cell and the shift cell detected by the processor and the second potential difference characteristic curve. In such an embodiment, it is preferably that the program cause the charge balance between the first and second standard cells to be adjusted based on the first and second capacity coefficient values.

According to the present invention, it is possible to detect a capacity coefficient easily and with high accuracy even in a potential plateau region of the standard cell capacity coefficient/voltage characteristic curve.

The foregoing and other objects, features and advantages of the present invention will become more apparent from the following detailed description of the embodiments with reference to the drawings.

DETAILED DESCRIPTION OF PREFERRED EMBODIMENTS OF THE INVENTION

As used herein, the term "cell capacity coefficient/voltage characteristic curve" refers to a curve showing the change in voltage of a given cell with respect to a capacity coefficient of the cell. The capacity coefficient of the cell represents the change in the capacity (e.g., state of charge) of the cell relative to the full state of capacity (e.g., the full state of charge) of the cell before deterioration of the cell. In such a curve, the change of voltage of the cell will typically be provided on one axis and the capacity coefficient will typically be provide on another axis (see, e.g., FIG. 3).

As used herein, the term "potential difference characteristic curve" means a curve indicating a change in the relationship of the difference in the open-circuit voltage (i.e., the potential difference) between a standard cell and a shift cell with respect to the capacity coefficient (e.g., the SOC) of the standard cell. The potential difference characteristic curve reflects the difference between the standard cell capacity coefficient/voltage characteristic curve and the shift cell capacity coefficient/voltage characteristic curve.

A representative embodiment of the invention will now be described with reference to FIG. 1. In this embodiment, the change of voltage of the cell is a change in the open circuit voltage (OCV) of the cell and the capacity coefficient of the cell is the change in the state of charge (SOC) of the cell (i.e., a percentage equal to the present state of charge of the cell over the full charge capacity of the standard cells before deterioration).

Figure 1:
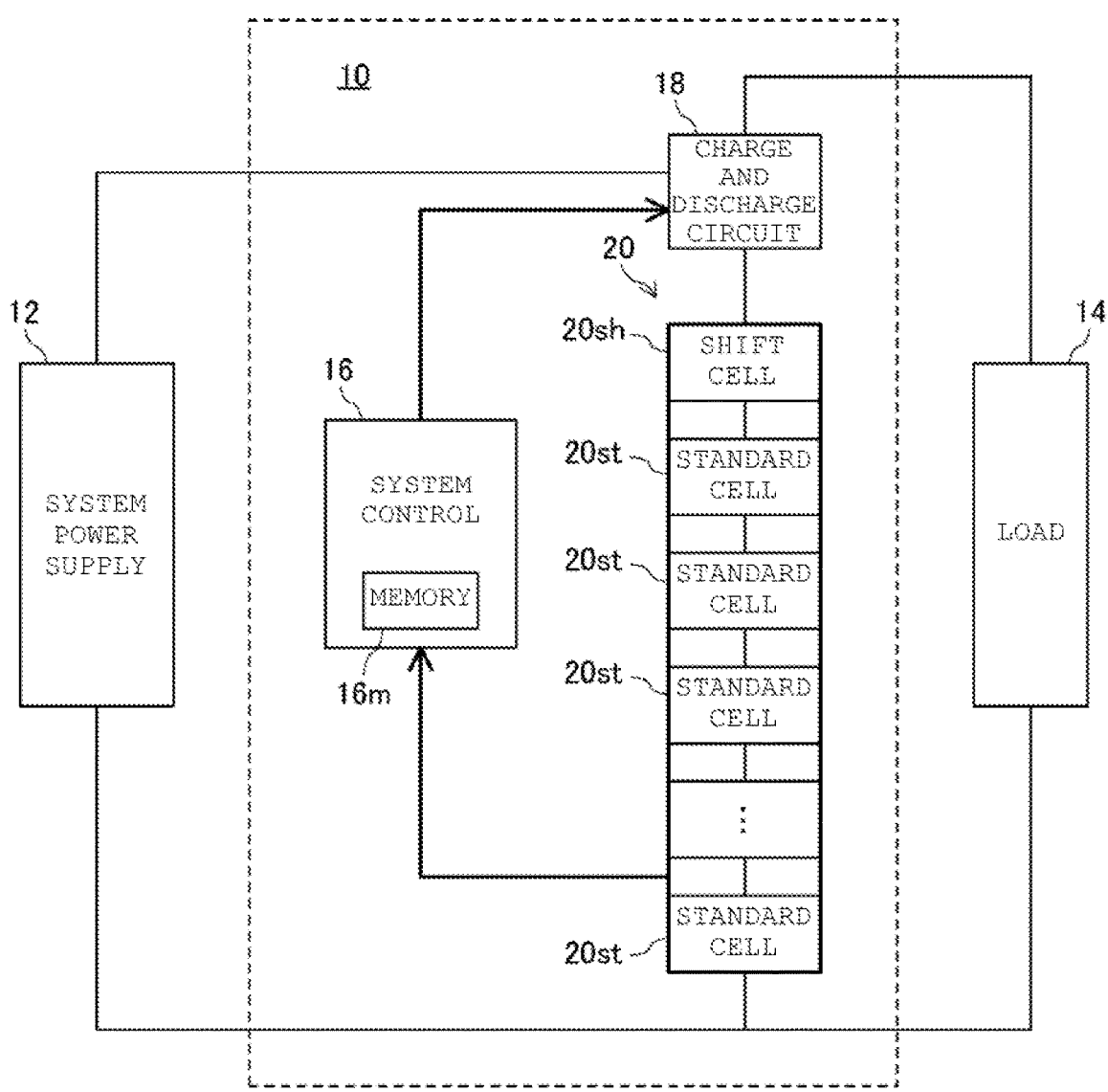
FIG. 1 is a block diagram showing a configuration of a battery pack circuit and its surroundings according to an embodiment of the invention.

As shown in FIG. 1, a battery pack circuit 10 includes a system control circuit 16 that controls the charging and discharging of a battery pack 20 through a charge and discharge circuit 18. Under the control of the system control circuit 16, the charge and discharge circuit 18 both charges the battery pack 20 with the power supplied from a system power supply 12 and discharges the power of the battery pack 20 to a load 14.

The battery pack 20 is formed by connecting K standard cells 20st (K being an integer greater than 1, for example, 7) and a single shift cell (specific cell) 20sh in series. The standard cells 20st and the shift cell 20sh are each preferably formed by laminating a plurality of positive and negative electrodes separated by a respective separator, storing them in a laminate, filling an electrolytic solution and sealing them. Although both the standard and shift cells 20st and 20sh have a standard capacity, their respective cell voltage characteristic curves differ as described further below.

Figure 2:
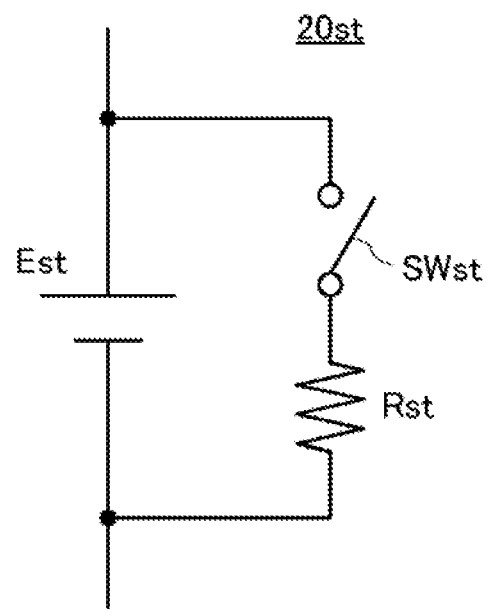
FIG. 2 is a circuit diagram showing an example of a configuration of a standard cell.

Each of the standard cell 20st is preferably configured as shown in FIG. 2. One end of a switch SWst is connected to the positive electrode of cell Est and the other end of the switch SWst is connected to one end of an external short-circuit resistor Rst. The other end of the external short-circuit resistor Rst is connected to the negative electrode of the cell Est. The value of the current discharged from the cell Est when the switch SWst is turned on (is closed) is defined by the terminal voltage value of the cell Est and the value of the external short-circuit resistor Rst.

The SOC is one of the capacity coefficients indicating the capacities of the standard and shift cells 20st and 20sh. In this embodiment, the SOC of each of the standard cells 20st is defined as "the present charge capacity of the standard cell 20st based on the full charge capacity of the standard cells 20st before deterioration". The SOC of the shift cell 20sh is defined as "the present charge capacity of the shift cell 20sh based on the full charge capacity of the shift cell 20sh before deterioration".

For both the standards and shift cells 20st and 20sh, the positive and negative electrodes are preferably made of olivine type lithium iron phosphate (LFP) and graphite (Gr), and the AC ratio (a counter charge capacity ratio between the positive and negative electrodes) is "1.75".

In this embodiment, the region where the SOC gradient of the positive electrode is 2 mV/SOC % or less occupies 30% or more of the effective SOC of the cell and the region where the SOC gradient of the negative electrode is 2.5 mV/SOC % occupies 30% or more of the effective SOC of the cell. In addition, the cell capacity is 4.5 Ah. That is, the material and design of the shift cell 20sh are the same as the material and design of the standard cells 20st.

Figure 3:
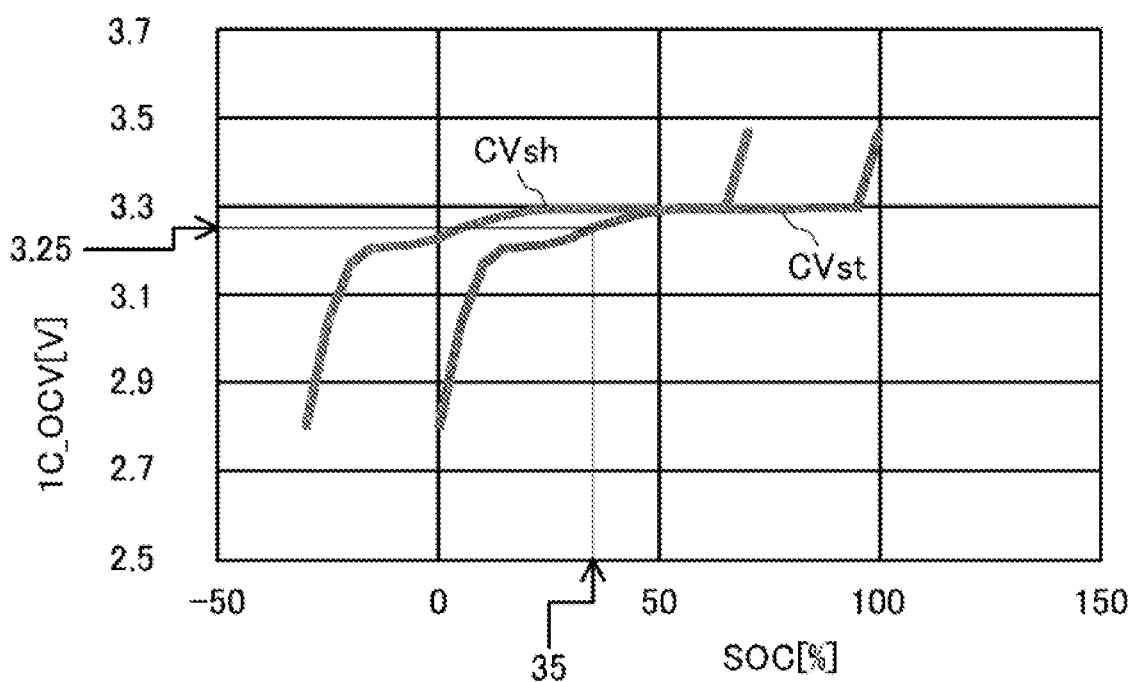
FIG. 3 is a graph showing an example of change in an open-circuit voltage with respect to SOC of a shift cell or a standard cell.

In the preferred embodiment disclosed, the change in voltage is an open circuit voltage and the change in capacity is the state Referring to FIG. 3, the curve CVst is the cell capacity coefficient/voltage characteristic curve of the standard cell 20st and the curve CVsh is the cell capacity coefficient/voltage characteristic curve of the shift cell 20sh. Curve CVst will sometimes be referred to as the "standard cell capacity coefficient/voltage characteristic curve" or the "standard curve." The curve CVsh will sometimes be referred to as the "shift cell capacity characteristic curve" or the "shift curve."

As shown in FIG. 3, the OCV value of the standard cell 20st is distributed in the range of 0% to 100% SOC, while the OCV value of the shift cell 20sh is distributed in the range of −30% to 70% SOC. However, since the material and design of the shift cell 20sh are the same as the material and design of the standard cells 20st, the curve CVsh overlaps a curve obtained by shifting the curve CVst by 30 percent (a predetermined amount) to the negative side along the horizontal axis direction.

As can be seen from FIG. 3, each of the curves CVst and CVsh has a respective potential plateau region (i.e., an SOC region where the voltage variation is small). However, since the standard cell capacity coefficient/voltage characteristic curve CVst and the shift cell capacity coefficient/voltage characteristic curve CVsh have the above-described relationship, the position of the potential plateau region of the standard cell capacity coefficient/voltage characteristic curve CVst is different from the position of the potential plateau region of the shift cell capacity coefficient/voltage characteristic curve CVsh.

Since there are individual differences between the standard cells 20st, standard cell capacity coefficient/voltage characteristic curve CVst is slightly different for each of the standard cells 20st.

The standard cell capacity coefficient/voltage characteristic curve CVst for each of the standard cells 20st also varies as a function of the operating environment (charge/discharge, and temperature of the battery pack 20) of the battery pack circuit 10. Similarly, the shift cell capacity coefficient/voltage characteristic curve CVsh also varies as a function of the operating environment of the battery pack circuit 10.

For this reason, a plurality of standard and shift cell capacity coefficient/voltage characteristic curves CVst, CVsh are stored for each of the standard and shift cells 20st and 20sh, each curve corresponding to a respective one of the cells operating in a respective operating environment. For example, if there are seven standard cells 20st and they are expected to operate in five different environments, thirty five standard cell characteristic curves CVst will be stored in memory 16m (i.e., a respective set of five curves, one for each operating environment, will be stored for each of the seven standard cells 20st). Similarly, five shift cells characteristic curves will be stored in memory 16m, one of each operating environment.

Figure 4:
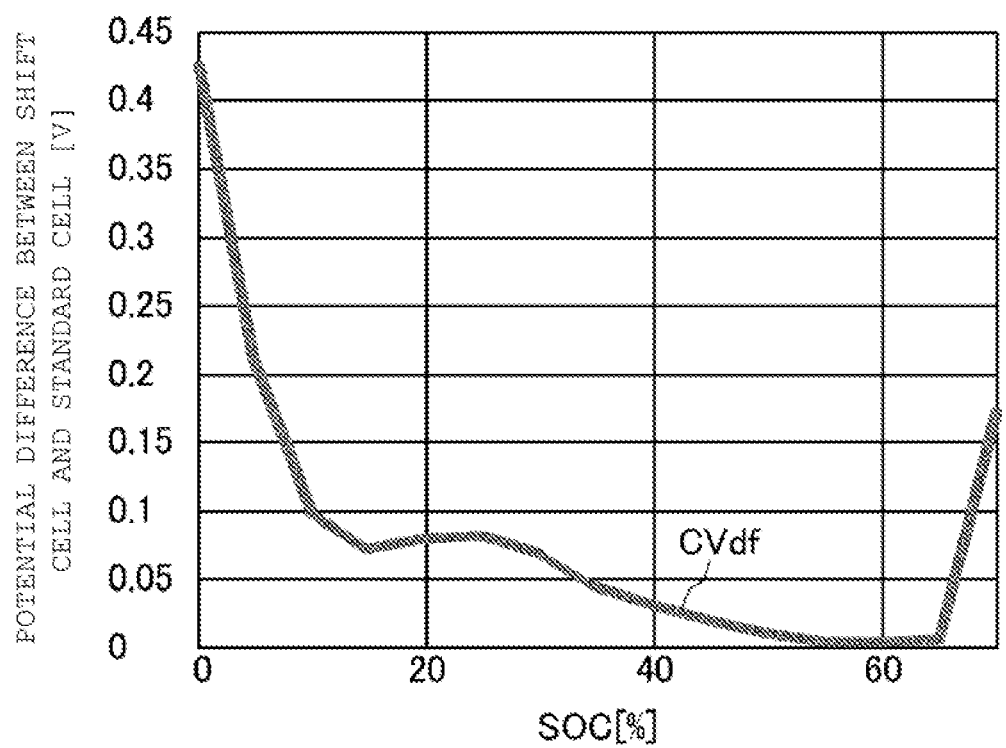
FIG. 4 is a graph showing an example of a change in a potential difference between a shift cell and a standard cell with respect to SOC of a shift cell or a standard cell.

FIG. 4 illustrates the potential difference characteristic curve CVdf for a selected on of the standard cell 20st and the shift cell 20sh in the SOC region of 0% or more and less than 70%. The potential difference characteristic curve CVdf reflects the difference between the standard cell capacity coefficient/voltage characteristic curve CVst and the shift cell capacity coefficient/voltage characteristic curve CVsh and fluctuates drastically except for a small region in the vicinity where the SOC has a value of 60%.

That is, the curve CVdf has a plurality of extreme values and the plateau region appears only in a very small region. This means that when detecting the SOC value with reference to the curve CVdf, small errors occur only in the vicinity of 60%.

As described above, the number of standard cell capacity coefficient/voltage characteristic curves CVst is equal to K×the number of operating environments and the number of shift cell capacity coefficient/voltage characteristic curves CVsh is equal to the number of operating environments. The memory 16m also pre-stores a number of potential difference characteristic curves CVdf equal to K×the number of operating environments (i.e., one potential difference characteristic curve CVdf for each operating environment).

The standard cells 20st and the shift cell 20sh having common materials and designs age deteriorate in the same way. For example, when the output characteristic of a standard cell 20st gradually deteriorates to 58%, the standard cell capacity coefficient/voltage characteristic curve CVst follows the track shown in FIG. 5. The characteristic curve of the shift cell 20sh also follows a deterioration track similar to that of the standard cell 20st. That is, the standard cell capacity coefficient/voltage characteristic curve CVst and the shift cell capacity coefficient/voltage characteristic curve CVsh are compressed at a predetermined compression ratio in a region other than the low SOC region.

Figure 5:
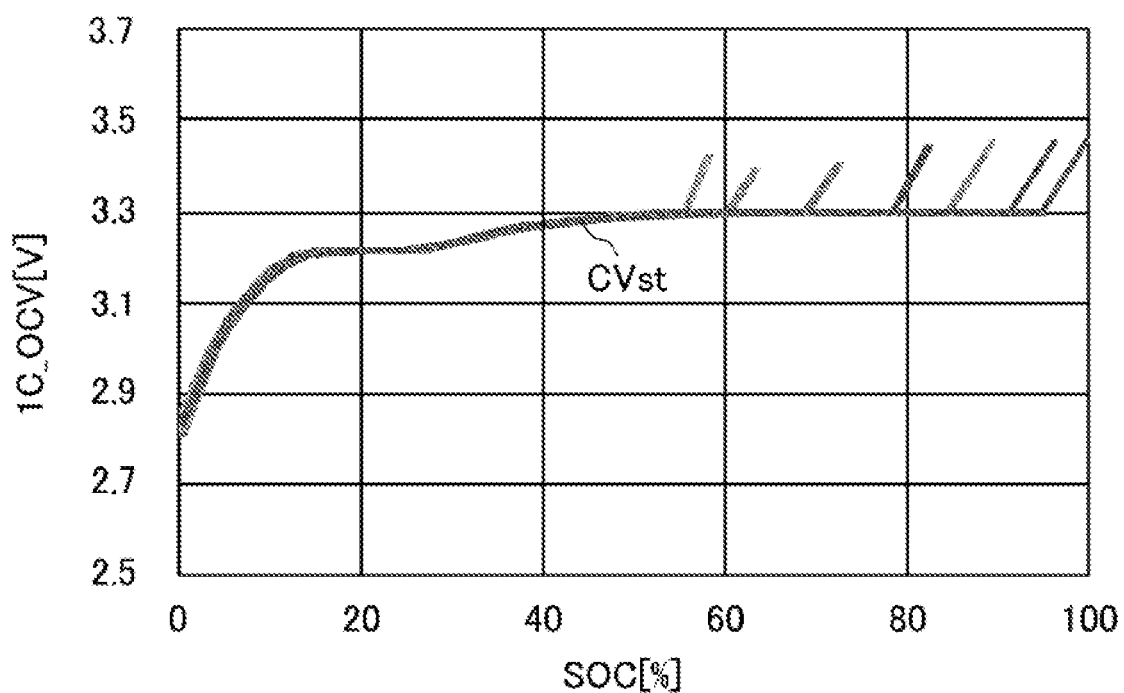
FIG. 5 is a graph showing an example of a change in deterioration of an output characteristic of a shift cell or a standard cell.

The standard cell capacity coefficient/voltage characteristic curve CVst shown in FIG. 5 shows the track when the output characteristics deteriorate in the order of 100%, 97%, 90%, 83%, 73%, 64%, and 58%.

Figure 6:
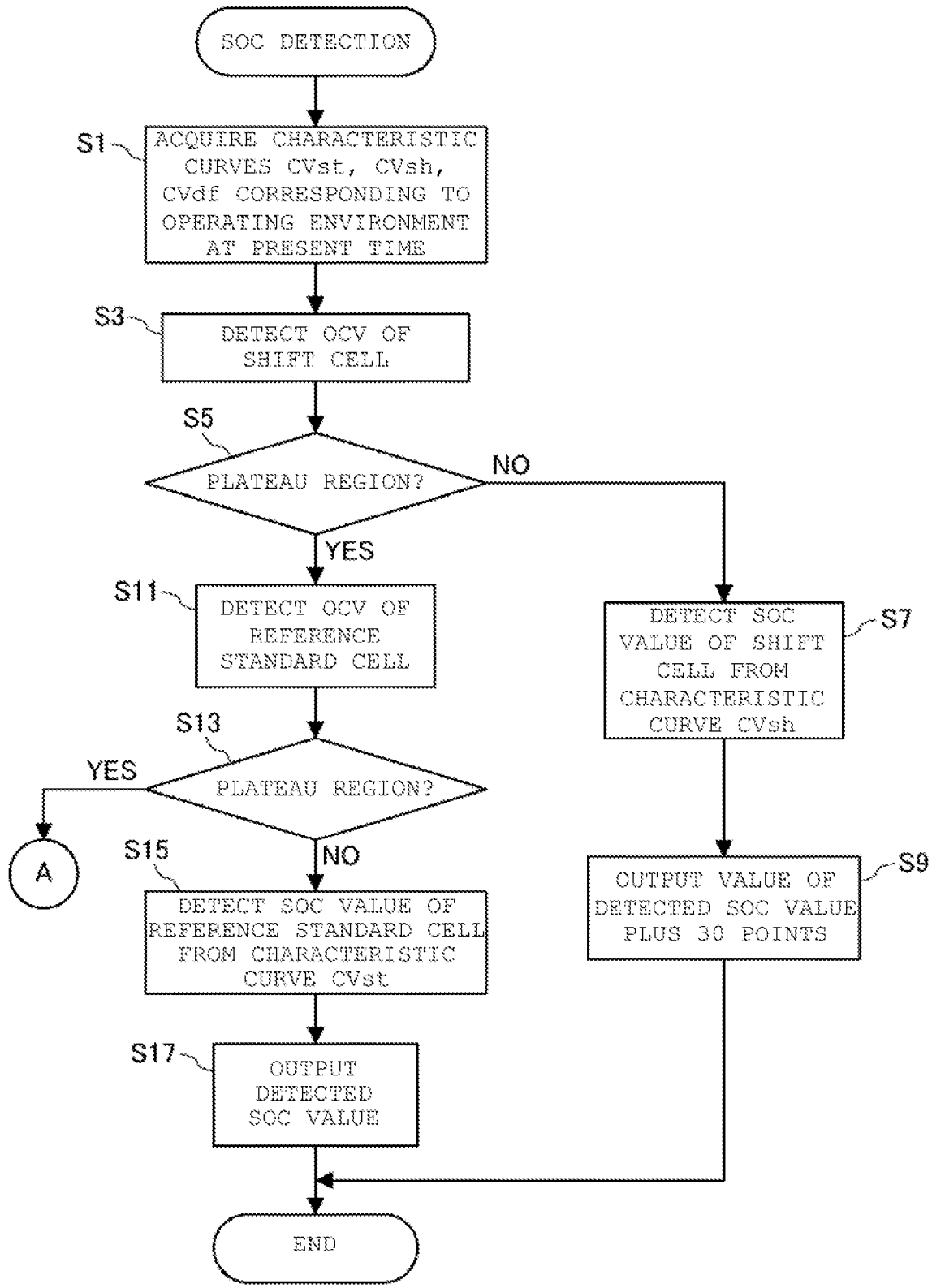
FIG. 6 is a flowchart showing part of an operation of a system control circuit shown in FIG. 1.
Figure 7:
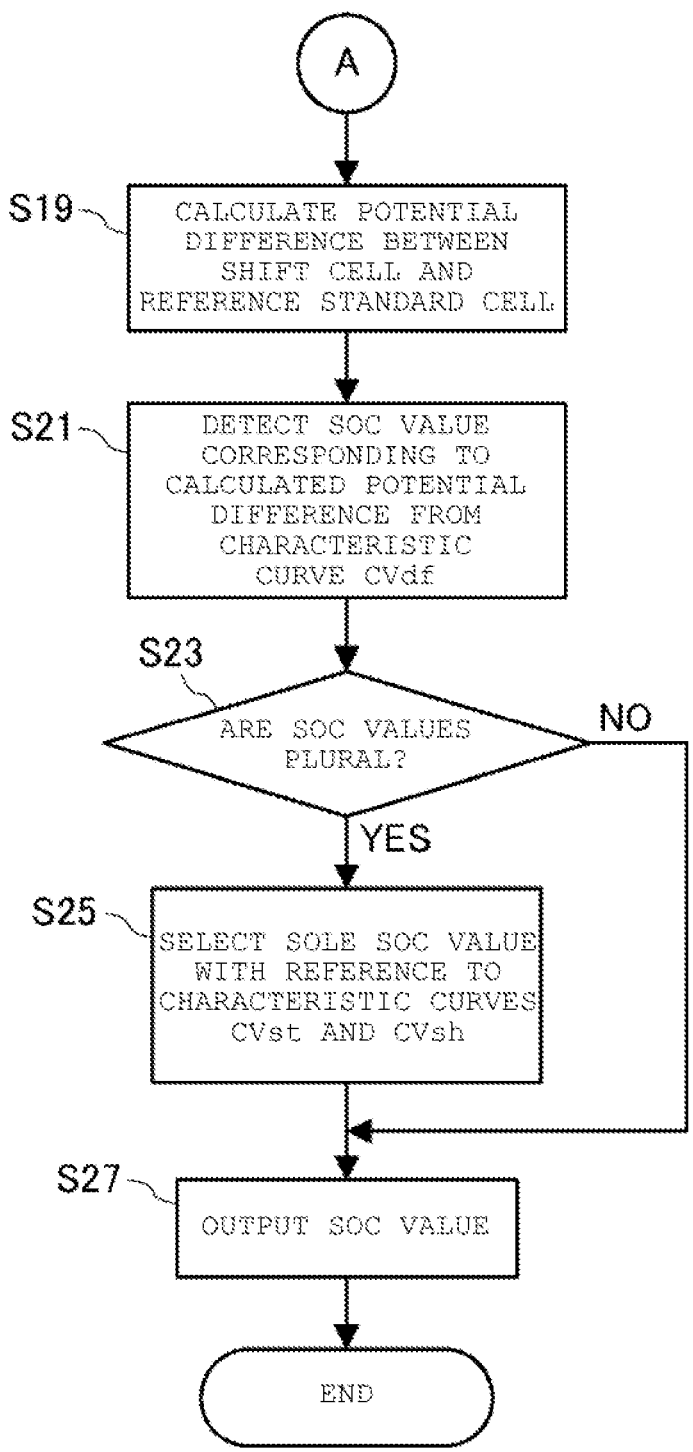
FIG. 7 is a flowchart showing another part of the operation of the system control circuit shown in FIG. 1.
Figure 8:
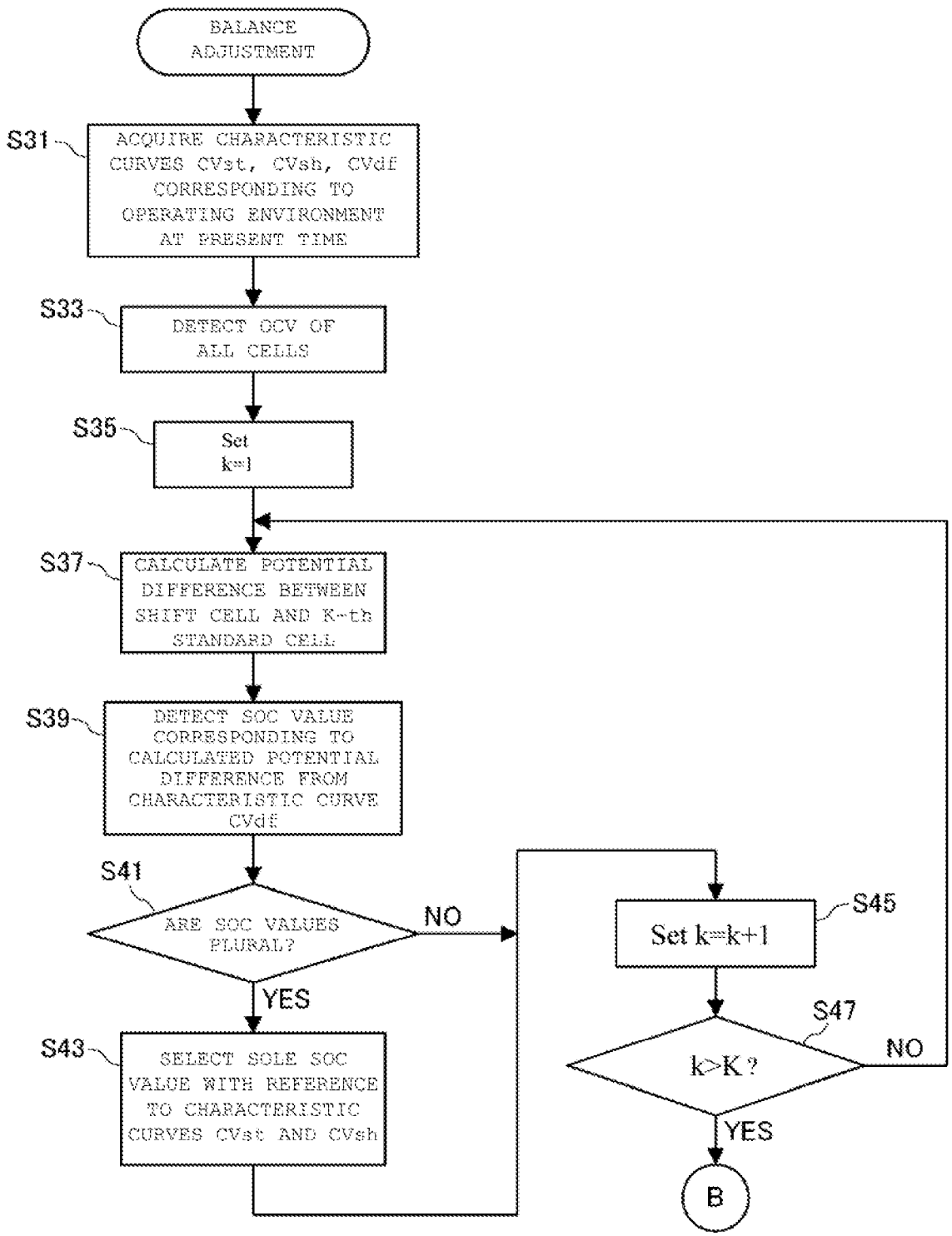
FIG. 8 is a flowchart showing another part of the operation of the system control circuit shown in FIG. 1.
Figure 9:
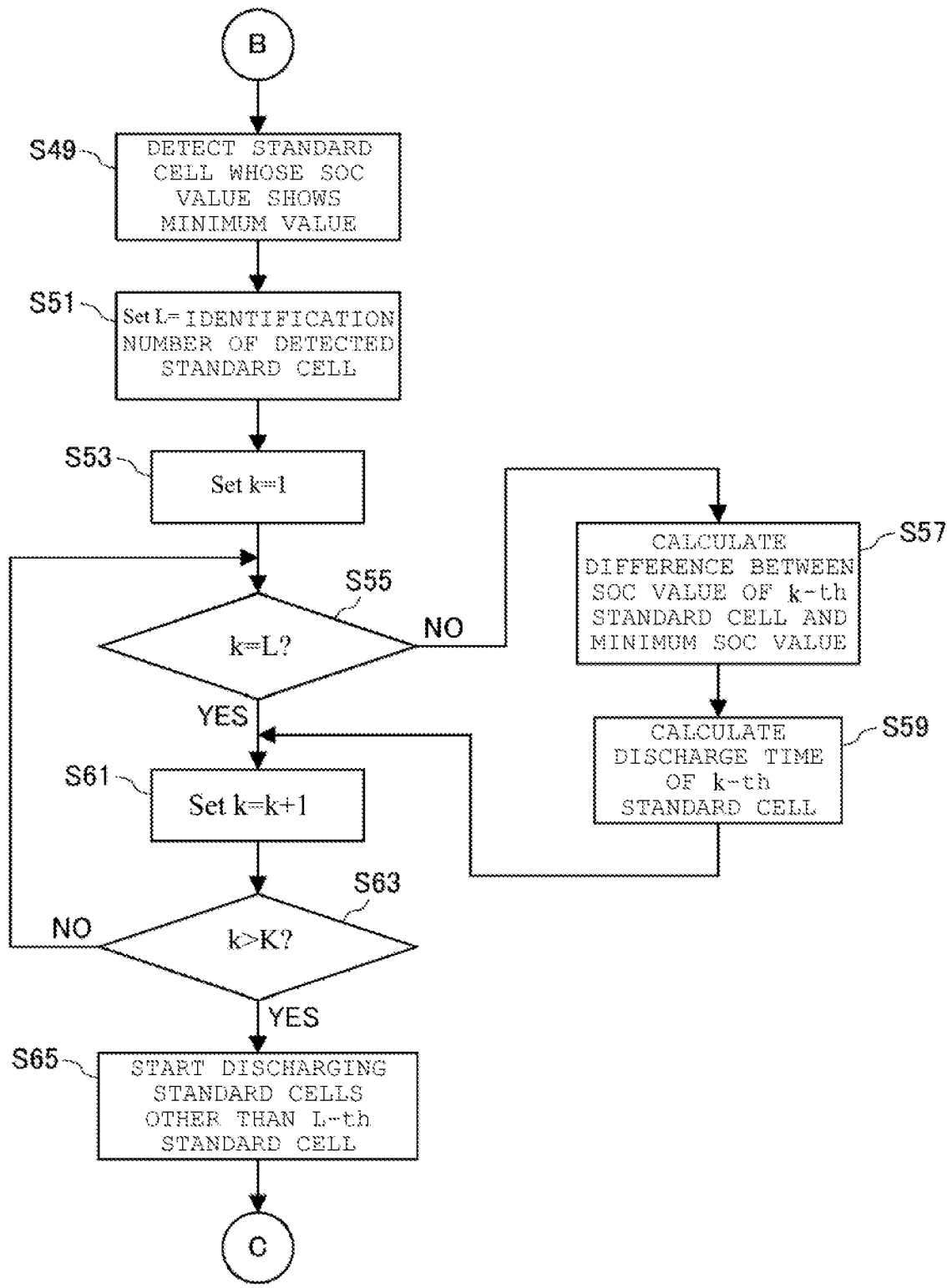
FIG. 9 is a flowchart showing still another part of the operation of the system control circuit shown in FIG. 1.
Figure 10:
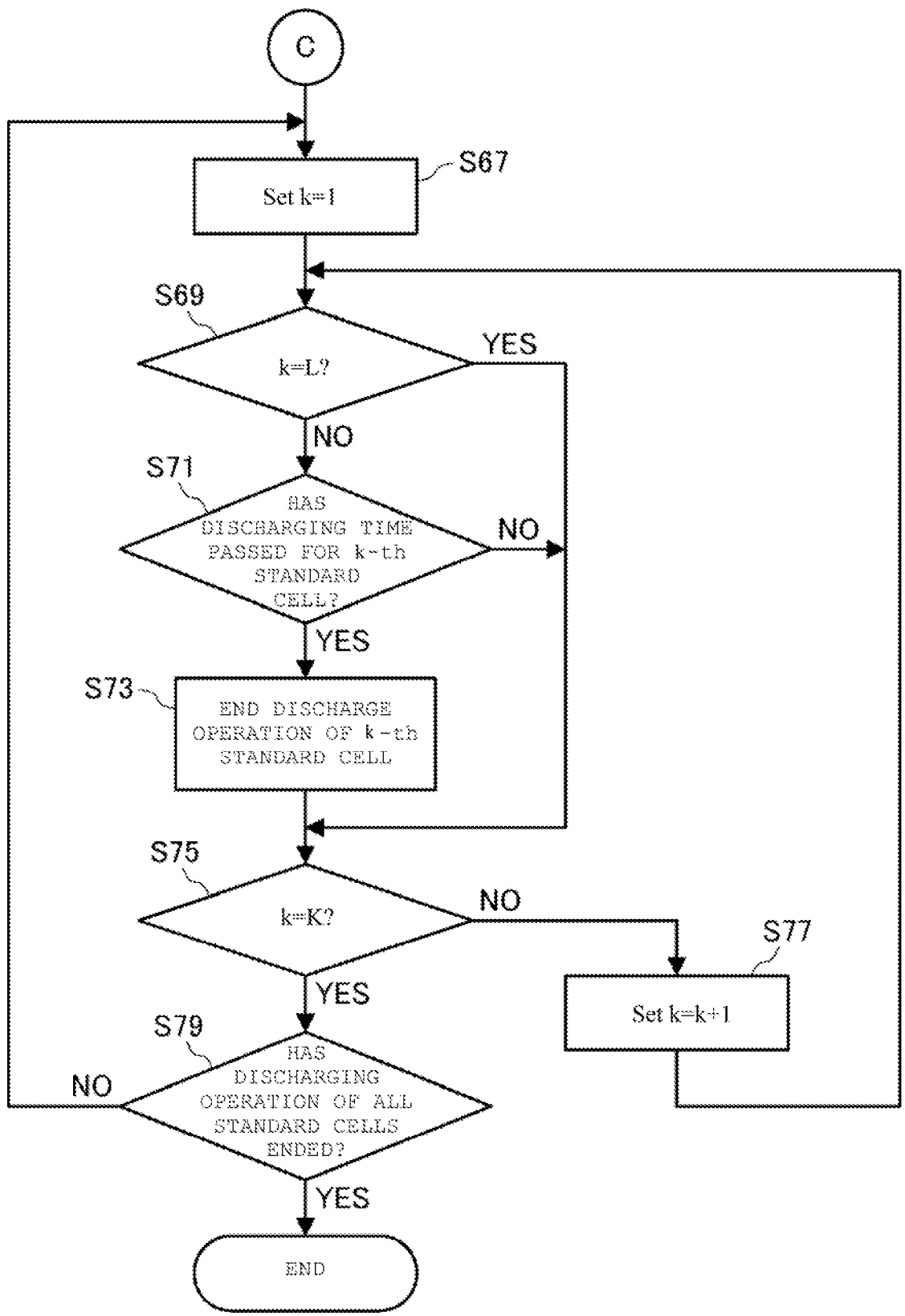
FIG. 10 is a flowchart showing another part of the operation of the system control circuit shown in FIG. 1.

The system control circuit (preferably a programmed processor) 26 repeatedly detects the SOC value of the standard cell 20st in accordance with the flowchart shown in FIGS. 6 and 7 and repeatedly adjusts the charge balance of the standard cell 20st and the shift cell 20sh in accordance with the flowchart shown in FIGS. 8 to 10. The control program corresponding to these flowcharts is preferably also stored in the memory 16m.

Referring to FIG. 6, in step S1, the standard cell capacity coefficient/voltage characteristic curve CVst, the shift cell capacity coefficient/voltage characteristic curve CVsh and the potential difference characteristic curve CVdf corresponding to the present operating environment are acquired from the memory 16m. For the standard cell capacity coefficient/voltage characteristic curve CVst, the capacity coefficient/voltage characteristic curve of a selected one of the K standard cells 20st is acquired. For the potential difference characteristic curve CVdf, the difference characteristic curve CVdf indicating the change in the potential difference between the shift cell 20sh and the reference standard cell 20st is acquired.

In step S3, the present open-circuit voltage (OCV) of the shift cell 20sh is detected. In step S5, it is determined whether the SOC value corresponding to the so detected open-circuit voltage falls within the potential plateau region on the shift cell capacity coefficient/voltage characteristic curve CVsh acquired in step S1. When the determination result is NO, the process proceeds to step S7. When the determination result is YES, the process proceeds to step S11.

In step S7, the present OCV of the shift cell 20sh detected in step S3 is checked against the shift cell capacity coefficient/voltage characteristic curve CVsh acquired in step S1 to detect the present SOC value of the shift cell 20sh. In step S9, a value obtained by adding 30 points (percent) to the detected SOC value is output as a present SOC value of the standard cell 20st and presented on a monitor (not shown). Thereafter the current SOC detection process is terminated.

In step S11, the present OCV of the reference standard cell 20st is detected. In step S13, it is determined whether the SOC value corresponding to the detected open-circuit voltage falls within the potential plateau region on the SOC-standard cell capacity coefficient/voltage characteristic curve CVst acquired in step S1. When the determination result is NO, the process proceeds to step S15. When the determination result is YES, the process proceeds to step S19 (FIG. 7).

In step S15, the OCV voltage of the reference standard cell 20st detected in step S11 is checked against the SOC-standard cell capacity coefficient/voltage characteristic curve CVst acquired in step S1, and the present SOC value of the reference standard cell 20st is detected. In step S17, the detected SOC value is output and displayed on the monitor as the present SOC value of the standard cell 20st. Thereafter the current SOC detection process is terminated.

In step S19 shown in FIG. 7, the present potential difference between the shift cell 20sh and the reference standard cell 20st is calculated. In step S21, one or more SOC values corresponding to the calculated potential difference are detected on the potential difference characteristic curve CVdf acquired in step S1.

When the potential difference characteristic curve CVdf acquired in step S1 is the curve shown in FIG. 4 and the potential difference calculated in step S19 is 0.05 V, two SOC values are detected in step S21, one at about 35% SOC and the other at about 67% SOC.

In step S23, it is determined whether the number of detected SOC values is 2 or more. When the determination result is NO, the process directly proceeds to step S27. When the determination result is YES, the following process is performed in step S25 and the program then proceeds to step S27.

In step S25, referring to at least one of the standard cell capacity coefficient/voltage characteristic curve CVst and the shift cell capacity coefficient/voltage characteristic curve CVsh acquired in step S1, the single SOC value corresponding to the open-circuit voltage of the reference standard cell 20st is selected. As can be seen from FIGS. 3 and 4, when the open-circuit voltage of the reference standard cell 20st is 3.25 V and the open-circuit voltage of the shift cell 20sh is 3.3 V, "35%" is selected as the SOC value in step S25.

In step S27, this single SOC value is output and displayed on the monitor. Thereafter the current SOC detection process is terminated.

Referring to FIG. 8, in step S31, K standard cell capacity coefficient/voltage characteristic curves CVst for the present operating environment, a single shift cell capacity coefficient/voltage characteristic curve CVsh for the present operating environment and K potential difference characteristic curves CVdf corresponding to the present operating are acquired from the memory 16m.

In step S33, the present open-circuit voltage of each of the K standard cells 20st and the single shift cell 20sh is detected for the present operating environment. In step S35, the variable k is set to "1" (corresponding to the first of the K standard cells) and in step S37, the present potential difference between the shift cell 20sh and the k-th standard cell 20st is calculated. In step S39, one or more SOC values corresponding to the calculated potential difference are detected on the k-th potential difference characteristic curve CVdf acquired in step S31.

In step S41, it is determined whether the number of detected SOC values is 2 or more. When the determination result is NO, the process directly proceeds to step S45. When the determination result is YES, the following process is performed in step S43 and then proceeds to step S45.

More particularly, in step S43, referring to at least one of the k-th standard cell capacity coefficient/voltage characteristic curve CVst and the shift cell capacity coefficient/voltage characteristic curve CVsh acquired in step S31, the SOC value corresponding to the open-circuit voltage of the k-th standard cell 20st is selected.

In step S45, the variable k is incremented by one, and in step S47, it is determined whether the variable k exceeds the constant K. When the determination result is NO, the process returns to step S37. When the determination result is YES, the process proceeds to step S49 (FIG. 9).

In step S49, the standard cell 20st whose SOC value indicates the minimum value is identified (determined) from among the K standard cells 20st. In step S51, the identification number of the identified standard cell 20st is set to a variable L. In step S53, the variable k is set to "1", and in step S55, it is determined whether the variable k is equal to the variable L. When the determination result is YES (and therefore the discharge time for the standard cell L does not have to be calculated), the process directly proceeds to step S61. When the result is NO, the following processes are performed in steps S57 to S59 and then proceeds to step S61.

In step S57, the difference between the SOC value of the k-th standard cell 20st and the minimum SOC value (i.e., the SOC value of the L-th standard cell 20st) is calculated. In step S59, for the k-th standard cell 20st, after the switch SWst is turned on, a balance current value is calculated from the value of the external short-circuit resistor Rst and the characteristic of the cell Est, and the discharge time of the K-th standard cell 20st is calculated based on the calculated balance current value and the difference calculated in step S57. The calculated discharging time is the time required for the SOC value of the k-th standard cell 20st to fall below the minimum SOC value.

In step S61, the variable k is incremented by one and in step S63, it is determined whether the variable k exceeds the constant K. When the determination result is NO, the process returns to step S55. When the determination result is YES, the process proceeds to step S65. In step S65, the switch SWst is turned on with respect to the standard cells 20st other than the L-th standard cell 20st and the process of discharging those cells is started.

In step S67 (FIG. 10), the variable k is set to "1". In step S69, it is determined whether the variable k is equal to the variable L (if it is, the standard cell 11 does not have to be discharged). In step S71, it is determined whether the discharge time set for the k-th standard cell 20st has elapsed. When the determination result in step S69 is YES or the determination result in step S71 is NO, the process proceeds to step S75. When the determination result in step S69 is NO and the determination result in step S71 is YES, in step S73, discharge operation of the k-th standard cell 20st is ended (i.e., switch SWst provided in the k-th standard cell 20st is turned off) and then proceeds to step S75.

In step S75, it is determined whether the variable k has reached the constant K. In step S79, it is determined whether all discharge operations of the K standard cells 20st have ended. When the determination result in step S75 is NO, the variable k is incremented by one in step S77 and then the process returns to step S69.

When the determination result in step S75 is YES and the determination result in step S79 is NO, the process returns to step S67. When both the determination result in step S75 and the determination result in step S79 are YES, the current balance adjustment processing is terminated.

As can be understood from the above description, the open-circuit voltage of the standard cells 20st varies along the standard cell capacity coefficient/voltage characteristic curve CVst, while the open-circuit voltage of the shift cell 20sh varies along the shift cell capacity coefficient/voltage characteristic curve CVsh. Here, the shift cell capacity coefficient/voltage characteristic curve CVsh overlaps a curve obtained by shifting the standard cell capacity coefficient/voltage characteristic curve CVst by a predetermined amount in the horizontal axis direction.

When detecting the SOC of the reference standard cell 20st (i.e., standard cell 20st designated in advance from among the K standard cells 20st), the system control circuit 16 acquires from the memory 16m the potential difference characteristic curve CVdf indicating the change in the potential difference between the reference standard cell 20st and the shift cell 20sh with respect to the SOC (S1) to calculate the present potential difference between the reference standard cell 20st and the shift cell 20sh (S19). Also, the system control circuit 16 checks the calculated the present potential difference against the potential difference characteristic curve CVdf to detect the present SOC value of the reference standard cell 20st (S21).

The system control circuit 16, when adjusting the a charge balance between the K standard cells 20st, acquires K potential difference characteristic curves CVdf corresponding to the Mmax standard cells 20st from the memory 16m (S31), detects a potential difference between the k-th (k: 1 to K) standard cell 20st and the shift cell 20sh (S37), and then, checks the detected potential difference against the k-th potential difference characteristic curve CVdf to detect the SOC value of the k-th standard cell 20st (S39).

The shift cell capacity coefficient/voltage characteristic curve CVsh overlaps a curve obtained by shifting the SOC-standard cell capacity coefficient/voltage characteristic curve CVst by a predetermined amount in the horizontal axis direction. Therefore, the potential difference can fluctuate largely on the SOC-potential difference characteristic curve CVdf even in the capacity coefficient region (potential plateau region) in which the variation in the voltage of the standard cell 20st is small. By referring to the potential difference characteristic curve CVdf as described above, it is possible to detect the SOC value of the standard cell 20st simply and with high accuracy even in the potential plateau region, and it is also possible to adjust the charge balance between the standard cells 20st based on the detected SOC value.

In addition, since the material and design of the shift cell 20sh are the same as the material and design of the standard cell 20st, the same rate characteristics and life characteristics can be obtained. As a result, it is possible to suppress the burden of operation of rebalancing the shift cell 20sh and the standard cell 20st.

Figure 11:
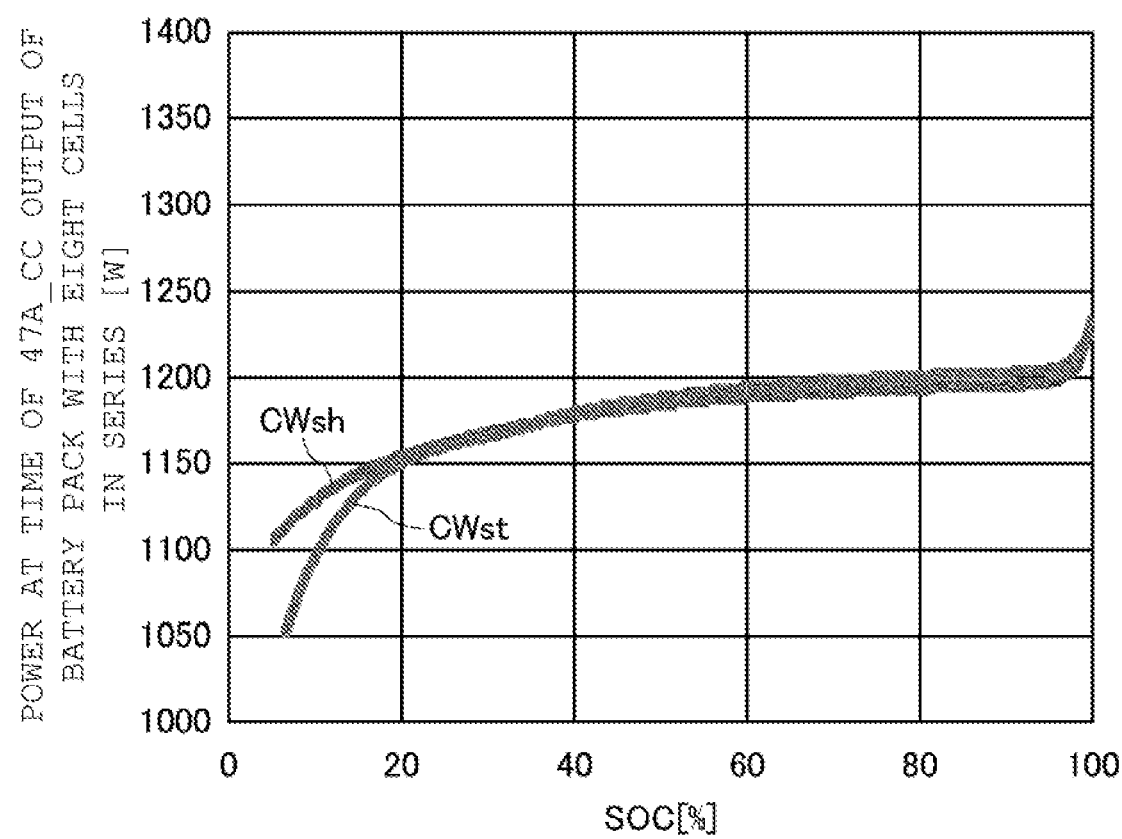
FIG. 11 is a graph showing an example of a change in electric power at the time of outputting 47A constant current with respect to SOC of a battery pack including eight standard cells or a battery pack including seven standard cells and one shift cell.

For reference, a change in power when a constant current is output from the battery pack 20 with the 47A load applied to the battery pack 20 of this embodiment, and a change in power when a constant current is output from a reference battery pack with the 47A load applied to the reference battery pack constituted by the eight standard cells 20st are shown in FIG. 11. According to FIG. 11, the former power varies along the curve CWsh while the latter power varies along the curve CWst.

Since the shift cell capacity coefficient/voltage characteristic curve CVsh varies as shown in FIG. 3, the total voltage of the battery pack 20 rises in the low SOC region, thereby improving the output power characteristic of the battery pack 20.

The increase in the total voltage of the battery pack 20 in the low SOC region means that the total voltage of the battery pack 20 is flattened in a region except for the plateau region, where the gradient of the region except for the plateau region is large. Thus, the battery pack 20 has high potential flatness and a wide SOC detection range.

In the foregoing embodiment, only one shift cell 20sh is provided (in the battery pack 20). However, if desired, two or more shift cells 20sh may be provided. In the foregoing embodiment, the shift amount is set to 30%, but the shift amount may be appropriately changed within a range of 10% or more and less than 50%.

Furthermore, in the foregoing embodiment, the battery pack circuit 10 is provided with a single battery pack 20. However, a plurality of battery packs 20 may be connected in parallel or in series, and the processes shown in FIGS. 6 to 10 may be performed for each battery pack 20.

Further, in the foregoing embodiment, the SOC value of the standard cell 20st is detected. Alternatively, the SOH value of the standard cell 20st may be detected.

Note that the SOH of the standard cell 20st can be defined as "the present full charge capacity of the standard cell 20st based on the full charge capacity of the standard cell 20st before deterioration", and the SOH of the shift cell 20sh can be defined as "the present full charge capacity of the shift cell 20sh based on the full charge capacity of the shift cell 20sh before deterioration".

Figure 12:
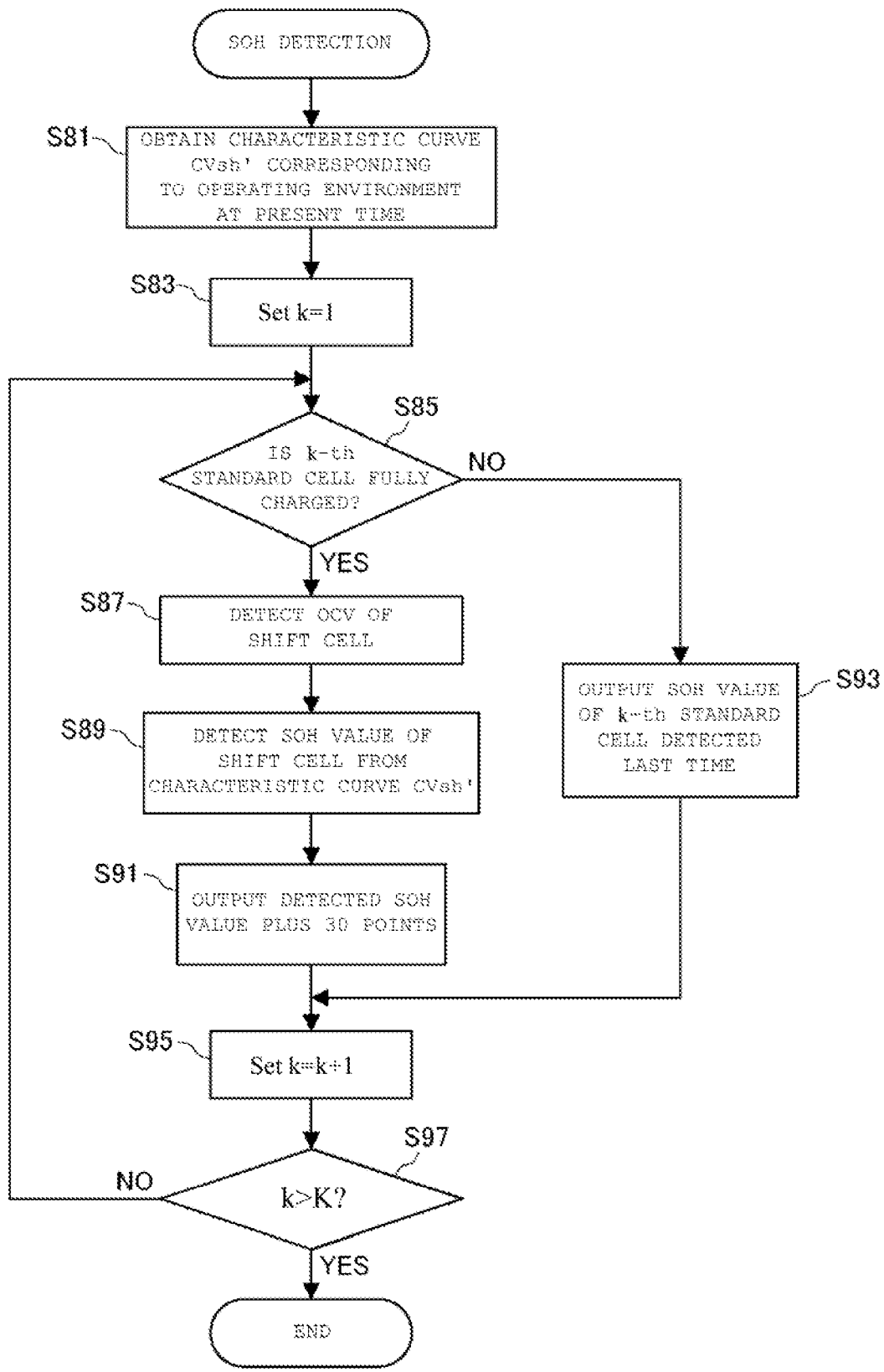
FIG. 12 is a flowchart showing part of an operation of a system control circuit in another embodiment.

In the case of detecting such a capacity coefficient, it is necessary to store in the memory 16m the shift cell capacity coefficient/voltage characteristic curve CVsh' showing the relationship between the open-circuit voltage of the shift cell 20sh and the SOH of the shift cell 20sh (the number of curves CVsh' to be stored equals the number of operating environments), and it is necessary to perform the process shown in FIG. 12 instead of the processes shown in FIGS. 6 to 7. Due to the nature of SOH, the balance adjustment as shown in FIGS. 8 to 10 is unnecessary.

Referring to FIG. 12, in step S81, the shift cell capacity coefficient/voltage characteristic curve CVsh' corresponding to the present operating environment is acquired from the memory 16m. In step S83, the variable k is set to "1", and in step S85, it is determined whether the k-th standard cell 20st is in the full charge state.

When the determination result is YES, the process proceeds to step S87 to detect the present open-circuit voltage of the shift cell 20sh. In step S89, the open-circuit voltage detected in step S87 is checked against the shift cell capacity coefficient/voltage characteristic curve CVsh' acquired in step S81 to detect the present SOH value of the shift cell 20sh. In step S91, a value obtained by adding 30 points to the detected SOH value is output from the monitor as the present SOH value of the k-th standard cell 20st. Upon completion of the output, the process proceeds to step S95.

When the determination result in step S85 is NO, the process proceeds to step S93 and the SOH value obtained in the previous step S91 targeting the k-th standard cell is output and displayed on the monitor. Upon completion of the output, the process proceeds to step S95.

In step S95, the variable k is incremented by one, and in step S97, it is determined whether the variable k exceeds the constant K. When the determination result is NO, the process returns to step S85. When the determination result is YES, the current SOH detection process is terminated.

DESCRIPTION OF REFERENCE SYMBOLS

10: battery pack circuit
12: system power supply
14: load
16: system control circuit
18: charge and discharge circuit
20: battery pack
20sh: shift cell
20st: standard cell

The invention claimed is:

1. A battery pack circuit that controls the charging and discharging of a battery pack which includes a first standard cell having a first standard cell capacity coefficient/voltage characteristic curve and a shift cell having a shift cell capacity coefficient/voltage characteristic curve, the shift cell capacity coefficient/voltage characteristic curve mirroring the standard cell capacity coefficient/voltage characteristic curve but being offset from the standard cell capacity coefficient/voltage characteristic curve by a predetermined amount along a reference axis of the shift cell and standard cell capacity coefficient/voltage characteristic curves, the battery pack circuit comprising:
a memory storing potential difference characteristic curves for the standard and shift cells;
a processor for determining a present capacity coefficient value of the standard cell by:
determining a present potential difference between the standard cell and the shift cell; and determining a present capacity coefficient value of the standard cell as a function of the present potential difference and the potential difference characteristic curve.

2. The battery pack circuit according to claim 1, wherein:
the memory stores the standard cell capacity coefficient/voltage characteristic curve and the shift cell capacity coefficient/voltage characteristic curve;
the potential difference characteristic curve has more than one capacity coefficient value for the detected present capacity coefficient value; and
the processor determines the present capacity coefficient value of the standard cell by selecting one of the more than one standard capacity coefficient values as a function of either the standard cell capacity coefficient/voltage characteristic curve or the shift cell capacity coefficient/voltage characteristic curve.

3. The battery pack circuit according to claim 2, wherein the processor causes the capacity coefficient value selected by the processor to be displayed.

4. The battery pack circuit according to claim 1, wherein the processor causes the capacity coefficient value selected by the processor to be displayed.

5. The battery pack circuit according to claim 1, wherein:
the present capacity coefficient value of the first standard cell is a first capacity coefficient value;
the battery back includes a second standard cell having a second standard cell capacity coefficient/voltage characteristic curve;
the memory stores a second potential difference characteristic curve for the second standard cell;
the processor detects a present potential difference between the second standard cell and the shift cell;
the processor determines a present capacity coefficient value of the second standard cell based on the present potential difference between the second standard cell and the shift cell detected by the processor and the second potential difference characteristic curve; and
the battery pack circuit includes a discharging circuit that adjusts a charge balance between the first and second standard cells based on the first and second capacity coefficient values.

6. A method for detecting a capacity coefficient of a battery forming part of a battery which includes a first standard cell having a first standard cell capacity coefficient/voltage characteristic curve and a shift cell having a shift cell capacity coefficient/voltage characteristic curve, the shift cell capacity coefficient/voltage characteristic curve mirroring the standard cell capacity coefficient/voltage characteristic curve but being offset from the standard cell capacity coefficient/voltage characteristic curve by a predetermined amount along a reference axis of the shift cell and standard cell capacity coefficient/voltage characteristic curves, the method comprising:
storing a potential difference characteristic curve for the standard and shift cells; and
determining a present capacity coefficient value of the standard cell by:
determining a present potential difference between the standard cell and the shift cell; and
determining a present capacity coefficient value of the standard cell as a function of the present potential difference and the potential difference characteristic curve.

7. The method according to claim 6, wherein:
the potential difference characteristic curve has more than one capacity coefficient value for the detected present capacity coefficient value; and
determining the present capacity coefficient value of the standard cell by selecting one of the more than one standard capacity coefficient values as a function of either the standard cell capacity coefficient/voltage characteristic curve or the shift cell capacity coefficient/voltage characteristic curve.

8. The method according to claim 7, further comprising displaying the selected present capacity coefficient value.

9. The method according to claim 6, further comprising displaying the selected present capacity coefficient value.

10. The method according to claim 6, wherein the present capacity coefficient value of the first standard cell is a first capacity coefficient value and the battery back includes a second standard cell having a second standard cell capacity coefficient/voltage characteristic curve, the method further comprising:
storing a second potential difference characteristic curve for the second standard cell;
detecting a present potential difference between the second standard cell and the shift cell; and
determining a present capacity coefficient value of the second standard cell based on the present potential difference between the second standard cell and the shift cell detected by the processor and the second potential difference characteristic curve; and
adjusting a charge balance between the first and second standard cells based on the first and second capacity coefficient values.

11. A non-transitory storage medium storing a program which that controls the charging and discharging of a battery pack which includes a first standard cell having a first standard cell capacity coefficient/voltage characteristic curve and a shift cell having a shift cell capacity coefficient/voltage characteristic curve, the shift cell capacity coefficient/voltage characteristic curve mirroring the standard cell capacity coefficient/voltage characteristic curve but being offset from the standard cell capacity coefficient/voltage characteristic curve by a predetermined amount along a reference axis of the shift cell and standard cell capacity coefficient/voltage characteristic curves, the program, when run on one or more processors, causing the battery back to:
store a potential difference characteristic curve for the standard and shift cells;
determining a present capacity coefficient value of the standard cell by:
determining a present potential difference between the standard cell and the shift cell; and
determining a present capacity coefficient value of the standard cell as a function of the present potential difference and the potential difference characteristic curve.

12. The non-transitory storage medium of claim 11, wherein the potential difference characteristic curve has more than one capacity coefficient value for the detected present capacity coefficient value and wherein the program causes the battery pack to determine the present capacity coefficient value of the standard cell by selecting one of the more than one standard capacity coefficient values as a function of either the standard cell capacity coefficient/voltage characteristic curve or the shift cell capacity coefficient/voltage characteristic curve.

13. The non-transitory storage medium according to claim 12, wherein the program further causes the battery pack to display the selected present capacity coefficient value.

14. The non-transitory storage medium according to claim 11, wherein the program further causes the battery pack to display the selected present capacity coefficient value.

15. The non-transitory storage medium according to claim 11, wherein:
- the present capacity coefficient value of the first standard cell is a first capacity coefficient value and the battery back includes a second standard cell having a second standard cell capacity coefficient/voltage characteristic curve; and
- the program causes the battery pack to:
  - store a second potential difference characteristic curve for the second standard cell;
  - detect a present potential difference between the second standard cell and the shift cell; and
  - determine a present capacity coefficient value of the second standard cell based on the present potential difference between the second standard cell and the shift cell detected by the processor and the second potential difference characteristic curve; and
  - adjust a charge balance between the first and second standard cells based on the first and second capacity coefficient values.

* * * * *